United States Patent
Tseng et al.

(10) Patent No.: US 8,768,993 B2
(45) Date of Patent: Jul. 1, 2014

(54) DIRECT CURRENT COMPENSATION SYSTEM AND METHOD FOR SCATTERING PARAMETER RATIONAL FUNCTIONS

(75) Inventors: Wen-Laing Tseng, Tu-Cheng (TW); Shen-Chun Li, Tu-Cheng (TW); Yu-Chang Pai, Tu-Cheng (TW); Shou-Kuo Hsu, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 503 days.

(21) Appl. No.: 13/038,386

(22) Filed: Mar. 2, 2011

(65) Prior Publication Data
US 2012/0016920 A1 Jan. 19, 2012

(30) Foreign Application Priority Data
Jul. 15, 2010 (TW) .................................. 99123358

(51) Int. Cl.
*G06F 1/02* (2006.01)
(52) U.S. Cl.
USPC ........................................................ 708/270

(58) Field of Classification Search
None
See application file for complete search history.

(56) References Cited

U.S. PATENT DOCUMENTS

2008/0059092 A1* 3/2008 Pupalaikis et al. .............. 702/66

FOREIGN PATENT DOCUMENTS

CN 101119357 2/2008

* cited by examiner

*Primary Examiner* — Michael D Yaary
(74) *Attorney, Agent, or Firm* — Novak Druce Connolly Bove + Quigg LLP

(57) ABSTRACT

A direct current compensation method for S-parameter rational functions reads S-parameters f(sk), which are generated at given frequency sk, from a storage unit. An S-parameter, which is generated at frequency sk=0 is supplemented into the S-parameters f(sk), upon the condition that there is no S-parameter which is generated at the frequency sk=0. An S-parameter ration function is generated according to the S-parameters f(sk). A DC level of the S-parameter rational function is compensated to generate a compensated S-parameter rational function.

6 Claims, 4 Drawing Sheets

DIRECT CURRENT COMPENSATION SYSTEM AND METHOD FOR SCATTERING PARAMETER RATIONAL FUNCTIONS

BACKGROUND

1. Technical Field

The present application is related to simulation systems for circuits, especially to a direct current (DC) compensation system and method for S-parameter rational functions.

2. Description of Related Art

S-parameters, also called scattering parameters, are used to describe signal-wave response of an n-port electrical network (circuit system) at given frequency.

S-parameters can be expressed by an S-parameter rational function, which is generated according to the S-parameters using a vector fitting algorithm. However, the S-parameter rational function generated using the vector fitting algorithm is an approximation, thus, may produce errors at a DC level of the signal-wave response of the n-port electrical networks.

DETAILED DESCRIPTION

The application is illustrated by way of examples and not by way of limitation in the figures of the accompanying drawings in which like references indicate similar elements. It should be noted that references to "an" or "one" embodiment in this disclosure are not necessarily to the same embodiment, and such references mean at least one.

In general, the word "module" as used hereinafter, refers to logic embodied in hardware or firmware, or to a collection of software instructions, written in a programming language, such as, for example, Java, C, or Assembly. One or more software instructions in the modules may be embedded in firmware. It will be appreciated that modules may be comprised of connected logic units, such as gates and flip-flops, and may be comprised of programmable units, such as programmable gate arrays or processors. The modules described herein may be implemented as either software and/or hardware modules and may be stored in any type of computer-readable medium or other computer storage device.

Figure 1:
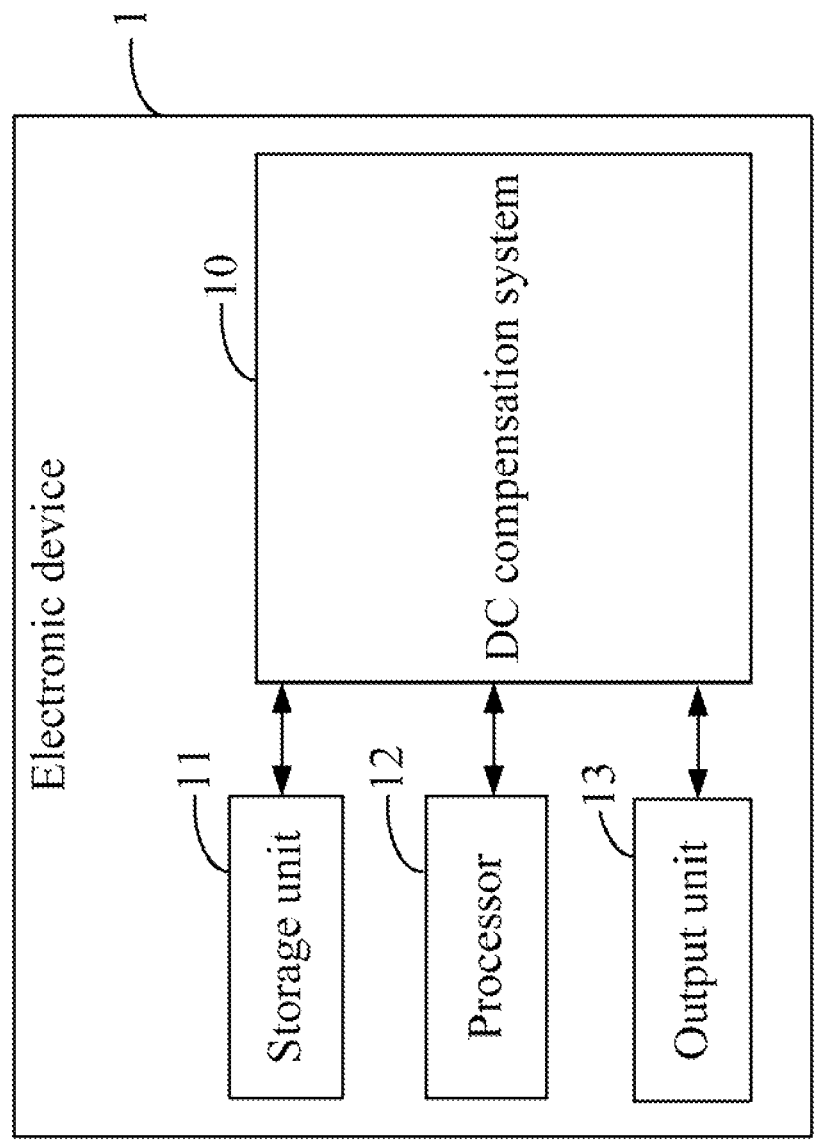
FIG. 1 is a block diagram of one embodiment of an electronic device comprising a DC compensation system.

FIG. 1 is a block diagram of one embodiment of an electronic device 1 comprising a DC compensation system 10. The electronic device 1 further comprises a storage unit 11, a processor 12, and an output unit 13. The electronic device 1 may be a computer, a server, for example. The storage device 11 is configured for storing information of an N-port circuit system in a Touchstone format (such as *.SNP), including S-parameters f(sk) which are generated at different frequency sk. The Touchstone Format is stipulated by IBIS Associates. The DC compensation system 10 includes function modules (see below descriptions referring to FIG. 2), which are configured for reading the S-parameters f(sk) from the storage unit 11, generating a S-parameter rational function according to the S-parameters f(sk) using a vector fitting algorithm, compensating the DC level of the S-parameter rational function to generate a compensated S-parameter rational function, and outputting the compensated S-parameter rational function to the output unit 13, such as a display.

In the embodiment, the function modules of the DC compensation system 10 may include one or more computerized codes in the form of one or more programs that are stored in the storage unit 11. The storage unit 11 may include high speed random access memory and may also include non-volatile memory, such as one or more magnetic disk storage devices, flash memory devices, or other non-volatile solid state memory devices. The one or more computerized codes of the DC compensation system 10 include instructions that are executed by the processor 12, to provide functions for the function modules of the DC compensation system 10.

Figure 2:
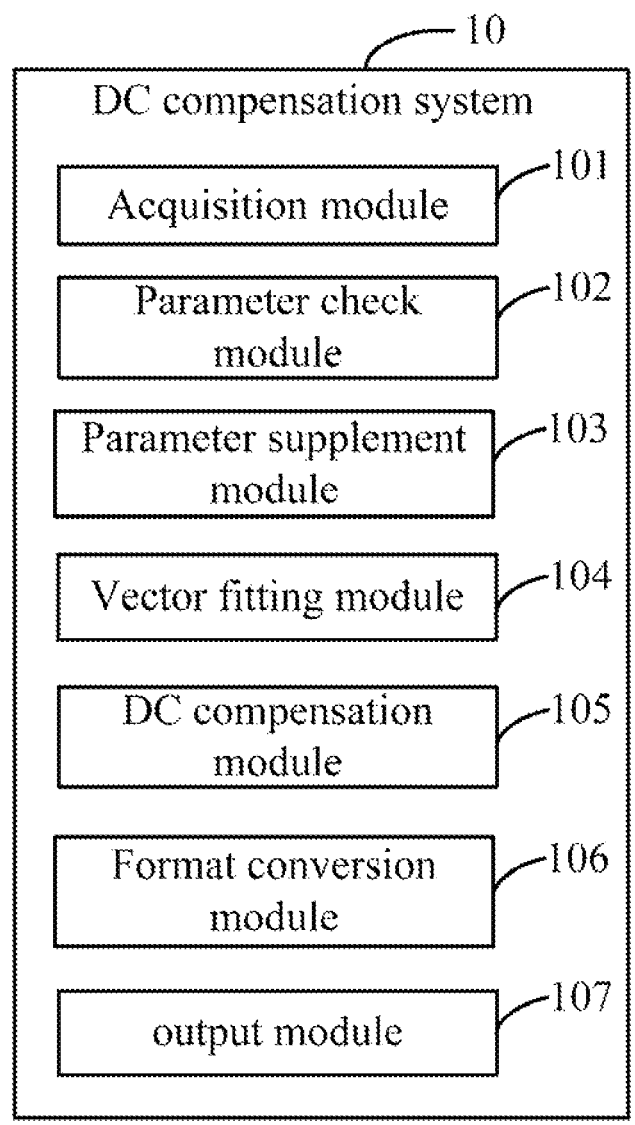
FIG. 2 is a block diagram of one embodiment of function modules of the DC compensation system of FIG. 1.

FIG. 2 is a block diagram illustrating the function modules of the DC compensation system 10, according to some embodiments of the present disclosure. The function modules of the DC compensation system 10 may includes an acquisition module 101, a parameter check module 102, a parameter supplement module 103, a vector fitting module 104, a DC compensation module 105, a format conversion module 106, and an output module 107.

The acquisition module 101 reads the S-parameters f(sk) from the storage unit 11. As mentioned, the S-parameters describe signal-wave response of an n-port electrical network (circuit system), and are generated at given frequency sk.

The parameter check module 102 checks if there is an S-parameter which is generated at the frequency sk=0. It may be appreciated that, the S-parameter generated at the frequency sk=0 represents DC.

The parameter supplement module 103 supplements the S-parameter at frequency sk=0 using an interpolation method if there is no S-parameter which is generated at the frequency sk=0. It may be appreciated that, the interpolation method is a method of constructing new data points within the range of a discrete set of known data points.

The vector fitting module 104 generates an S-parameter ration function according to the S-parameters f(sk) using a vector fitting algorithm. In one embodiment, the S-parameter rational function is constituted by pole values $p_m$ and residue values $r_m$, and is shown below:

$$S(s) \approx \hat{S}(s) = \begin{bmatrix} \hat{S}_{11}(s) & \hat{S}_{12}(s) & \ldots & \hat{S}_{1N}(s) \\ \hat{S}_{21}(s) & \hat{S}_{22}(s) & \ldots & \hat{S}_{2N}(s) \\ \ldots & \ldots & \ldots & \ldots \\ \hat{S}_{N1}(s) & \hat{S}_{N2}(s) & \ldots & \hat{S}_{NN}(s) \end{bmatrix}, \text{ where } \hat{S}_{ij}(s) = \sum_{m=1}^{M} \frac{r_m^{i,j}}{s - p_m^{i,j}}.$$

The DC compensation module 105 compensates the DC level of the above S-parameter rational function to generate a compensated S-parameter rational function using the following steps:

(1) computing the pole values $p_m$ using first formulas as follows:

$$p_{2u} = \frac{u/100 + j \cdot u}{s_N - s_1}, \quad p_{2u-1} = \frac{u/100 - j \cdot u}{s_N - s_1},$$

where $\mu = 1 \sim M/2$, and M is a total number of the pole values.

(2) generating a matrix $$X: \begin{bmatrix} r_1 \\ \cdots \\ r_M \\ d \\ \tilde{r}_1 \\ \cdots \\ \tilde{r}_M \end{bmatrix}$$

using unknown variables $r_m$, $d$, and $\tilde{\gamma}_m$ of functions $(\sigma f)_{fit}$ and $\sigma_{fit}(s)$. In one embodiment, the functions $(\sigma f)_{fit}(s)$ and $\sigma_{fit}(s)$ are shown as follows:

$$(\sigma f)_{fit}(s) = f(0) + s\left(\sum_{m=1}^{M} \frac{r_m}{s - p_m} + d\right); \text{ and}$$

$$\sigma_{fit}(s) = \sum_{m=1}^{M} \frac{\tilde{r}_m}{s - p_m} + 1.$$

(3) Substituting the pole values $p_m$ and the S-parameters f(sk) into matrixes A and B. In one embodiment, the matrixes A and B are shown as follows:

$$matrixA = \begin{bmatrix} \frac{s_1}{s_1 - p_1} & \cdots & \frac{s_1}{s_1 - p_M} & s_1 & \frac{-f(s_1)}{s_1 - p_1} & \cdots & \frac{-f(s_1)}{s_1 - p_M} \\ \cdots & \cdots & \cdots & \cdots & \cdots & \cdots & \cdots \\ \frac{s_k}{s_k - p_1} & \cdots & \frac{s_k}{s_k - p_M} & s_k & \frac{-f(s_k)}{s_k - p_1} & \cdots & \frac{-f(s_k)}{s_k - p_M} \\ \cdots & \cdots & \cdots & \cdots & \cdots & \cdots & \cdots \\ \frac{s_K}{s_K - p_1} & \cdots & \frac{s_K}{s_K - p_M} & s_N & \frac{-f(s_K)}{s_K - p_1} & \cdots & \frac{-f(s_K)}{s_K - p_M} \end{bmatrix}; \text{ and}$$

$$matrixB = \begin{bmatrix} f(s_1) - f(0) \\ \cdots \\ f(s_k) - f(0) \\ \cdots \\ f(s_K) - f(0) \end{bmatrix}.$$

(4) computing the unknown variables $r_m$, $d$, and $\tilde{\gamma}_m$, using a formula $X = (A^T A)^{-1} A^T B$, to get the functions $(\sigma f)_{fit}(s)$ and $\sigma_{fit}(s)$.

(5) recording the got $(\sigma f)_{fit}(s)$ as $(\sigma f)_{fit\_old}(s)$ upon the condition that steps (2)~(4) are only executed one time, and computing the pole values $p_m$ again using a second formula as follows:

$$\sigma_{fit}(s) = \sum_{m=1}^{M} \frac{\tilde{r}_m}{s - p_m} + 1 = \frac{\prod_{m=1}^{M}(s - z_m)}{\prod_{m=1}^{M}(s - p_m)},$$

where $p_m = z_m$, $m = 1 \sim M$.

(6) repeating steps (2)~(4), determining if $|(\sigma f)_{fit}(s) - (\sigma f)_{fit\_old}(s)| < tol$, where the tol is a predetermined error, and regarding the got $(\sigma f)_{fit}(s)$ as the compensated S-parameter rational function.

The format conversion module 106 converts a format of the compensated S-parameter rational function to a standard format, for being compatible with HSPICE simulation software. The conversion is realized as follows: Firstly, expressing the S-parameters f(sk) using a following matrix:

$$S(s) = \begin{bmatrix} S_{11}(s) & S_{12}(s) & \cdots & S_{1N}(s) \\ S_{21}(s) & S_{22}(s) & \cdots & S_{2N}(s) \\ \cdots & \cdots & \cdots & \cdots \\ S_{N1}(s) & S_{N2}(s) & \cdots & S_{NN}(s) \end{bmatrix}.$$

Secondly, substituting the $S_{ij}(s)$, where i, j=1~N, of the above matrix into the compensated S-parameter rational function, obtaining a matrix as follows:

$$S(s) \approx \hat{S}(s) = \begin{bmatrix} \hat{S}_{11}(s) & \hat{S}_{12}(s) & \cdots & \hat{S}_{1N}(s) \\ \hat{S}_{21}(s) & \hat{S}_{22}(s) & \cdots & \hat{S}_{2N}(s) \\ \cdots & \cdots & \cdots & \cdots \\ \hat{S}_{N1}(s) & \hat{S}_{N2}(s) & \cdots & \hat{S}_{NN}(s) \end{bmatrix},$$

where $\hat{S}_{ij}(s) = \hat{S}_{ij}(0) + s\left(\sum_{m=1}^{M} \frac{r_m^{i,j}}{s - p_m^{i,j}} + d^{i,j}\right).$ After that, converting the format of the compensated S-parameter rational function in to the standard format according to the $\hat{S}_{ij}(s)$:

$$\hat{S}_{ij}(s) = \sum_{m=1}^{M} \frac{\tilde{r}_m^{i,j}}{s - p_m^{i,j}} + \tilde{d}^{i,j} + se^{i,j},$$

where $$\tilde{r}_m^{i,j} = p_m^{i,j} r_m^{i,j}, \quad \tilde{d}^{i,j} = \hat{S}_{ij}(0) + \sum_{m=1}^{M} r_m^{i,j},$$

and $$e_m^{i,j} = d_m^{i,j}.$$

The output module 107 stores the compensated S-parameter rational function into the storage unit 11, and outputs the compensated S-parameter rational function to the output unit 13.

Figure 3:
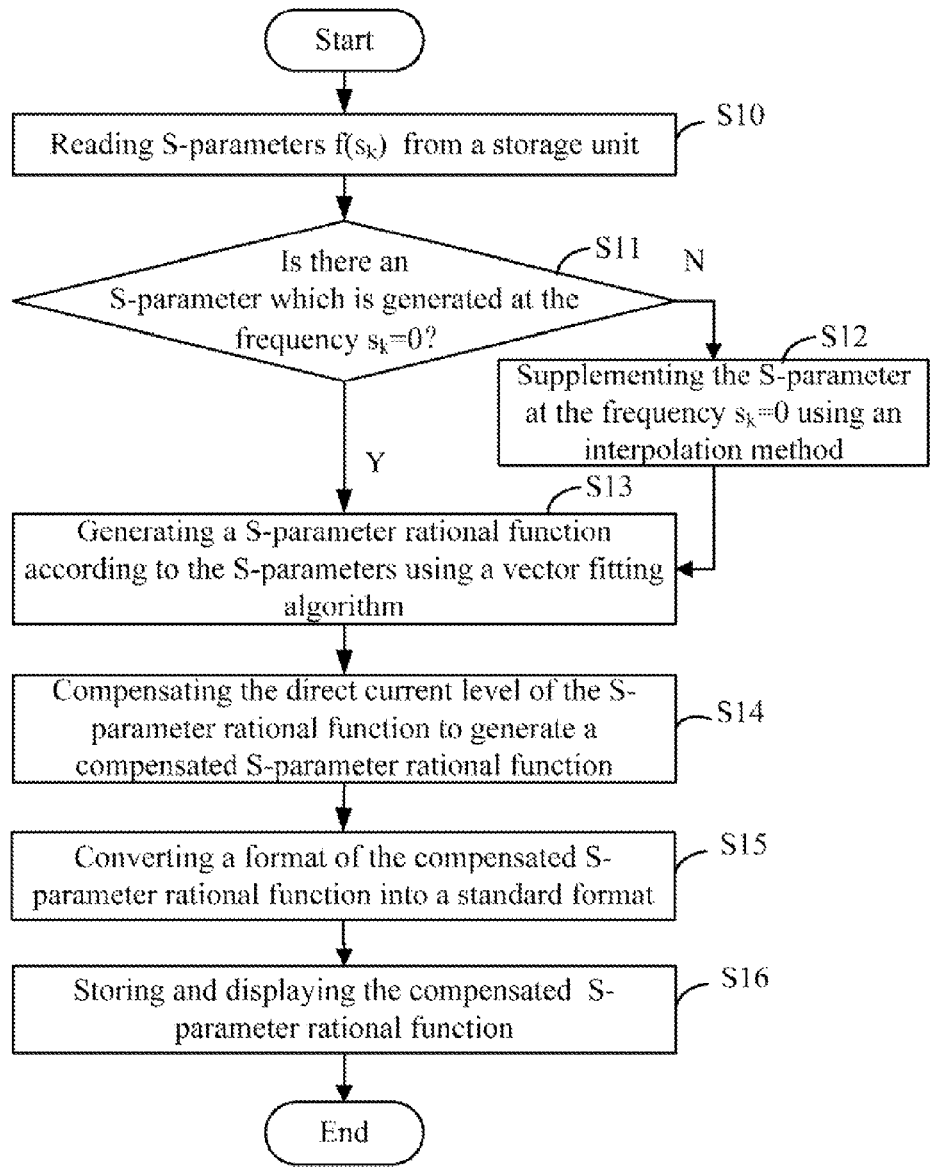
FIG. 3 is a flowchart illustrating one embodiment of a DC compensation method for S-parameter rational functions.

FIG. 3 is a flowchart illustrating one embodiment of a DC compensation method for S-parameter rational functions. The method being performed by execution of computer readable program code by the processor 12 of the electronic device 1. Depending on the embodiment, additional blocks in the flow of FIG. 3 may be added, others removed, and the ordering of the blocks may be changed.

In block S10, the acquisition module 101 reads the S-parameters f(sk), which are generated at given frequency sk, from the storage unit 11.

In block S11, the parameter check module 102 checks if there is an S-parameter which is generated at the frequency sk=0. Block S13 is implemented if there is an S-parameter which is generated at the frequency sk=0. Otherwise, block S12 is implemented if there is no S-parameter which is generated at the frequency sk=0.

In block S12, the parameter supplement module 103 supplements the S-parameter at frequency sk=0 using an interpolation method. It may be appreciated that, the interpolation method is a method of constructing new data points within the range of a discrete set of known data points.

In block S13, the vector fitting module 104 generates an S-parameter ration function according to the S-parameters f(sk) using a vector fitting algorithm. In one embodiment, the S-parameter rational function is constituted by pole values $p_m$ and residue values $r_m$, and is shown below:

$$S(s) \approx \hat{S}(s) = \begin{bmatrix} \hat{S}_{11}(s) & \hat{S}_{12}(s) & \ldots & \hat{S}_{1N}(s) \\ \hat{S}_{21}(s) & \hat{S}_{22}(s) & \ldots & \hat{S}_{2N}(s) \\ \ldots & \ldots & \ldots & \ldots \\ \hat{S}_{N1}(s) & \hat{S}_{N2}(s) & \ldots & \hat{S}_{NN}(s) \end{bmatrix},$$

$$\text{where } \hat{S}_{ij}(s) = \sum_{m=1}^{M} \frac{r_m^{i,j}}{s - p_m^{i,j}}.$$

In block S14, the DC compensation module 105 compensates the DC level of the above S-parameter rational function to generate a compensated S-parameter rational function. The detailed description of block S14 refers to FIG. 4 below.

In block S15, the format conversion module 106 converts a format of the compensated S-parameter rational function to a standard format, for being compatible with HSPICE simulation software. The conversion is realized as follows: Firstly, expressing the S-parameters f(sk) using a following matrix:

$$S(s) = \begin{bmatrix} S_{11}(s) & S_{12}(s) & \ldots & S_{1N}(s) \\ S_{21}(s) & S_{22}(s) & \ldots & S_{2N}(s) \\ \ldots & \ldots & \ldots & \ldots \\ S_{N1}(s) & S_{N2}(s) & \ldots & S_{NN}(s) \end{bmatrix}.$$

Secondly, substituting the $S_{ij}(s)$, where i,j=1~N, of the above matrix into the compensated S-parameter rational function, obtaining a matrix as follows:

$$S(s) \approx \hat{S}(s) = \begin{bmatrix} \hat{S}_{11}(s) & \hat{S}_{12}(s) & \ldots & \hat{S}_{1N}(s) \\ \hat{S}_{21}(s) & \hat{S}_{22}(s) & \ldots & \hat{S}_{2N}(s) \\ \ldots & \ldots & \ldots & \ldots \\ \hat{S}_{N1}(s) & \hat{S}_{N2}(s) & \ldots & \hat{S}_{NN}(s) \end{bmatrix},$$

$$\text{where } \hat{S}_{ij}(s) = \hat{S}_{ij}(0) + s \left( \sum_{m=1}^{M} \frac{r_m^{i,j}}{s - p_m^{i,j}} + d^{i,j} \right).$$

After that, converting the format of the compensated S-parameter rational function in to the standard format according to the $\hat{S}_{ij}(s)$:

$$\hat{S}_{ij}(s) = \sum_{m=1}^{M} \frac{\tilde{r}_m^{i,j}}{s - \tilde{p}_m^{i,j}} + \tilde{d}^{i,j} + s e^{i,j},$$

where $$\tilde{r}_m^{i,j} = p_m^{i,j} r_m^{i,j}, \quad \tilde{d}_m^{i,j} = \hat{S}_{ij}(0) + \sum_{m=1}^{M} r_m^{i,j},$$

and $$e_m^{i,j} = d_m^{i,j}.$$

In block S16, the output module 107 stores the compensated S-parameter rational function into the storage unit 11, and outputs the compensated S-parameter rational function to the output unit 1.

Figure 4:
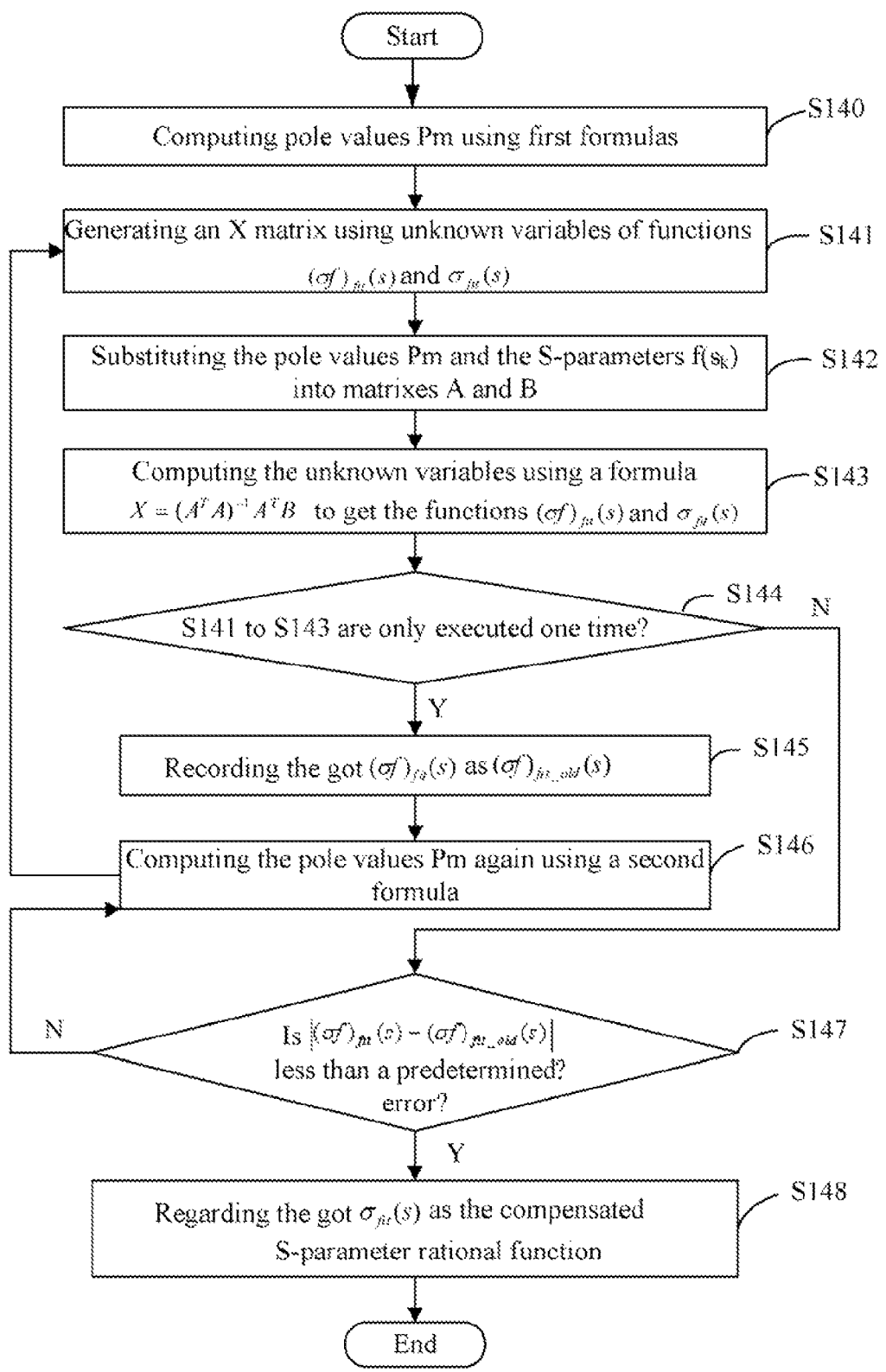
FIG. 4 is a flowchart detailing block S14 of FIG. 3.

FIG. 4 is a flowchart detailing block S14 of FIG. 3. The method being performed by execution of computer readable program code by the processor 12 of the electronic device 1. Depending on the embodiment, additional blocks in the flow of FIG. 4 may be added, others removed, and the ordering of the blocks may be changed.

In block S140, the DC compensation module 105 computing the pole values $p_m$ using first formulas as follows:

$$p_{2u} = \frac{u/100 + j \cdot u}{s_N - s_1}, \quad p_{2u-1} = \frac{u/100 - j \cdot u}{s_N - s_1},$$

where $\mu=1\sim M/2$, and M is a total number of the pole values.

(7) In block S141, the DC compensation module 105 generates a matrix $$X : \begin{bmatrix} r_1 \\ \ldots \\ r_M \\ d \\ \tilde{r}_1 \\ \ldots \\ \tilde{r}_M \end{bmatrix}$$

using unknown variables $r_m$, d, and $\tilde{\gamma}_m$ of functions $(\sigma f)_{fit}(s)$ and $\sigma_{fit}(s)$. In one embodiment, the functions $(\sigma f)_{fit}(s)$ and $\sigma_{fit}(s)$ are shown as follows:

$$(\sigma f)_{fit}(s) = f(0) + s \left( \sum_{m=1}^{M} \frac{r_m}{s - p_m} + d \right); \text{ and}$$

$$\sigma_{fit}(s) = \sum_{m=1}^{M} \frac{\tilde{r}_m}{s - p_m} + 1.$$

In block S142, the DC compensation module 105 substitutes the pole values $p_m$ and the S-parameters f(sk) into matrixes A and B. In one embodiment, the matrixes A and B are shown as follows:

$$matrixA = \begin{bmatrix} \frac{s_1}{s_1 - p_1} & \ldots & \frac{s_1}{s_1 - p_M} & s_1 & \frac{-f(s_1)}{s_1 - p_1} & \ldots & \frac{-f(s_1)}{s_1 - p_M} \\ \ldots & \ldots & \ldots & \ldots & \ldots & \ldots & \ldots \\ \frac{s_k}{s_k - p_1} & \ldots & \frac{s_k}{s_k - p_M} & s_k & \frac{-f(s_k)}{s_k - p_1} & \ldots & \frac{-f(s_k)}{s_k - p_M} \\ \ldots & \ldots & \ldots & \ldots & \ldots & \ldots & \ldots \\ \frac{s_K}{s_K - p_1} & \ldots & \frac{s_K}{s_K - p_M} & s_N & \frac{-f(s_K)}{s_K - p_1} & \ldots & \frac{-f(s_K)}{s_K - p_M} \end{bmatrix}; \text{ and}$$

-continued $$matrixB = \begin{bmatrix} f(s_1) - f(0) \\ \cdots \\ f(s_k) - f(0) \\ \cdots \\ f(s_K) - f(0) \end{bmatrix}.$$

In block S143, the DC compensation module 105 computes the unknown variables $r_m$, d, and $\tilde{\gamma}_m$ using a formula $X=(A^T A)^{-1} A^T B$, to get the functions $(\sigma f)_{fit}(s)$ and $\sigma_{fit}(s)$.

In block S144, the DC compensation module 105 determines if blocks S141 to S143 are only executed one time. Block S145 is implemented if blocks S141 to S143 are only executed one time. Otherwise, block S147 is implemented if blocks S141 to S143 are executed more than one time.

In block S145, the DC compensation module 105 records the got $(\sigma f)_{fit}(s)$ as $(\sigma f)_{fit\_old}(s)$.

In block S146, the DC compensation module 105 computes the pole values $p_m$ again using a second formula as follows:

$$\sigma_{fit}(s) = \sum_{m=1}^{M} \frac{\tilde{r}_m}{s - p_m} + 1 = \frac{\prod_{m=1}^{M}(s - z_m)}{\prod_{m=1}^{M}(s - p_m)},$$

where $p_m = z_m$, $m = 1 \sim M$.

After block S146, the flow returns to block S141 described above.

In block S147, the DC compensation module 105 determines if $|(\sigma f)_{fit}(s) - (\sigma f)_{fit\_old}(s)| < tol$, where the tol is a predetermined error. Block S141 is repeated if $|(\sigma f)_{fit}(s) - (\sigma f)_{fit\_old}(s)| \geq tol$. Otherwise, block S148 is implemented if $|(\sigma f)_{fit}(s) - (\sigma f)_{fit\_old}(s)| < tol$.

In block S148, the DC compensation module 105 regards the got $(\sigma f)_{fit}(s)$ as the compensated S-parameter rational function.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A direct current (DC) compensation method for S-parameter rational functions, the method comprising:
   reading S-parameters f(sk) which are generated at given frequency sk from a storage unit, the S-parameters indicative of an n-port network;
   supplementing an S-parameter, which is generated at frequency sk=0, into the S-parameters f(sk) using an interpolation method, upon the condition that there is no S-parameter which is generated at the frequency sk=0;
   generating an S-parameter rational function according to the S-parameters f(sk) using a vector fitting algorithm;
   compensating a DC level of the S-parameter rational function to generate a compensated S-parameter rational function, comprising:
   (a) computing the pole values $p_m$ using first formulas as follows:

$$p_{2u} = \frac{u/100 + j \cdot u}{s_N - s_1}, \quad p_{2u-1} = \frac{u/100 - j \cdot u}{s_N - s_1},$$

where u=1~M/2, and M is a total number of the pole values;
   (b) generating a matrix X:

$$X : \begin{bmatrix} r_1 \\ \cdots \\ r_M \\ d \\ \tilde{r}_1 \\ \cdots \\ \tilde{r}_M \end{bmatrix}$$

using unknown variables $r_m$, d, and $\tilde{\gamma}_m$ of functions $(\sigma f)_{fit}(s)$ and $\sigma_{fit}(s)$, wherein the functions $(\sigma f)_{fit}(s)$ and $\sigma_{fit}(s)$ are shown as follows:

$$(\sigma f)_{fit}(s) = f(0) + s\left(\sum_{m=1}^{M} \frac{r_m}{s - p_m} + d\right), \quad \sigma_{fit}(s) = \sum_{m=1}^{M} \frac{\tilde{r}_m}{s - p_m} + 1;$$

(c) substituting the pole values $p_m$ and the S-parameters f(sk) into matrixes A and B, wherein the matrixes A and B are shown as follows:

$$matrixA = \begin{bmatrix} \frac{s_1}{s_1 - p_1} & \cdots & \frac{s_1}{s_1 - p_M} & s_1 & \frac{-f(s_1)}{s_1 - p_1} & \cdots & \frac{-f(s_1)}{s_1 - p_M} \\ \cdots & \cdots & \cdots & \cdots & \cdots & \cdots & \cdots \\ \frac{s_k}{s_k - p_1} & \cdots & \frac{s_k}{s_k - p_M} & s_k & \frac{-f(s_k)}{s_k - p_1} & \cdots & \frac{-f(s_k)}{s_k - p_M} \\ \cdots & \cdots & \cdots & \cdots & \cdots & \cdots & \cdots \\ \frac{s_K}{s_K - p_1} & \cdots & \frac{s_K}{s_K - p_M} & s_N & \frac{-f(s_K)}{s_K - p_1} & \cdots & \frac{-f(s_K)}{s_K - p_M} \end{bmatrix},$$

$$matrixB = \begin{bmatrix} f(s_1) - f(0) \\ \cdots \\ f(s_k) - f(0) \\ \cdots \\ f(s_K) - f(0) \end{bmatrix};$$

(d) computing the unknown variables $r_m$, d, and $\tilde{\gamma}_m$ using a formula $X=(A^T A)^{-1} A^T B$, to get the functions $(\sigma f)_{fit}(s)$ and $\sigma_{fit}(s)$;
   (e) recording the got $(\sigma f)_{fit}(s)$ as $(\sigma f)_{fit\_old}(s)$ upon the condition that steps (b)~(d) are only executed one time, and computing the pole values $p_m$ again using second formulas as follows:

$$\sigma_{fit}(s) = \sum_{m=1}^{M} \frac{\tilde{r}_m}{s - p_m} + 1 = \frac{\prod_{m=1}^{M}(s - z_m)}{\prod_{m=1}^{M}(s - p_m)},$$

where $p_m = z_m$, $m = 1 \sim M$;
   (f) repeating steps (b)~(d), determining if $|(\sigma f)_{fit}(s) - (\sigma f)_{fit\_old}(s)| < tol$, wherein the tol is a predetermined error, and regarding the got $(\sigma f)_{fit}(s)$ as the compensated S-parameter rational function; and storing the compensated S-parameter rational function into the storage unit.

2. The DC compensation method as described in claim 1, wherein the S-parameters stored in the storage unit are in a Touchstone format.

3. A non-transitory storage medium having stored thereon instructions that, when executed by a processor, cause the processor to perform a direct current (DC) compensation method for S-parameter rational functions, wherein the method comprises:

reading S-parameters f(sk), which are generated at given frequency sk, from a storage unit;

supplementing an S-parameter, which is generated at frequency sk=0, into the S-parameters f(sk), using an interpolation method, upon the condition that there is no S-parameter which is generated at the frequency sk=0;

generating an S-parameter rational function according to the S-parameters f(sk) using a vector fitting algorithm;

compensating a DC level of the S-parameter rational function to generate a compensated S-parameter rational function, comprising:

(a) computing the pole $p_m$ using first formulas as follows:

$$p_{2u} = \frac{u/100 + j \cdot u}{s_N - s_1}, \quad p_{2u-1} = \frac{u/100 - j \cdot u}{s_N - s_1},$$

where u=1~M/2, and M is a total number of the pole values;

(b) generating a matrix:

$$X : \begin{bmatrix} r_1 \\ \ldots \\ r_M \\ d \\ \tilde{r}_1 \\ \ldots \\ \tilde{r}_M \end{bmatrix}$$

using unknown variables $r_m$, d, and $\tilde{\gamma}_m$ of functions $(\sigma f)_{fit}(s)$ and $\sigma_{fit}(s)$, wherein the functions $(\sigma f)_{fit}(s)$ and $\sigma_{fit}(s)$ are shown as follows:

$$(\sigma f)_{fit}(s) = f(0) + s\left(\sum_{m=1}^{M} \frac{r_m}{s - p_m} + d\right), \quad \sigma_{fit}(s) = \sum_{m=1}^{M} \frac{\tilde{r}_m}{s - p_m} + 1;$$

(c) substituting the pole values $p_m$ and the S-parameters f(sk) into matrixes A and B, wherein the matrixes A and B are shown as follows:

$$matrixA = \begin{bmatrix} \frac{s_1}{s_1 - p_1} & \ldots & \frac{s_1}{s_1 - p_M} & s_1 & \frac{-f(s_1)}{s_1 - p_1} & \ldots & \frac{-f(s_1)}{s_1 - p_M} \\ \ldots & \ldots & \ldots & \ldots & \ldots & \ldots & \ldots \\ \frac{s_k}{s_k - p_1} & \ldots & \frac{s_k}{s_k - p_M} & s_k & \frac{-f(s_k)}{s_k - p_1} & \ldots & \frac{-f(s_k)}{s_k - p_M} \\ \ldots & \ldots & \ldots & \ldots & \ldots & \ldots & \ldots \\ \frac{s_K}{s_K - p_1} & \ldots & \frac{s_K}{s_K - p_M} & s_N & \frac{-f(s_K)}{s_K - p_1} & \ldots & \frac{-f(s_K)}{s_K - p_M} \end{bmatrix},$$

$$matrixB = \begin{bmatrix} f(s_1) - f(0) \\ \ldots \\ f(s_k) - f(0) \\ \ldots \\ f(s_K) - f(0) \end{bmatrix};$$

(d) computing the unknown variables $r_m$, d, and $\tilde{\gamma}_m$ using a formula $X=(A^T A)^{-1} A^T B$, to get the functions $(\sigma f)_{fit}(s)$ and $\sigma_{fit}(s)$;

(e) recording the got $(\sigma f)_{fit}(s)$ as $(\sigma f)_{fit\_old}(s)$ upon the condition that steps (b)~(d) are only executed one time, and computing the pole $p_m$ again using a second formulas as follows:

$$\sigma_{fit}(s) = \sum_{m=1}^{M} \frac{\tilde{r}_m}{s - p_m} + 1 = \frac{\prod_{m=1}^{M}(s - z_m)}{\prod_{m=1}^{M}(s - p_m)},$$

wherein $p_m = z_m$, m=1~M;

(f) repeating steps (b)~(d), determining if $|(\sigma f)_{fit}(s) - (\sigma f)_{fit\_old}(s)| <$ tol, wherein the tol is a predetermined error, and regarding the got $(\sigma f)_{fit}(s)$ as the compensated S-parameter rational function; and storing the compensated S-parameter rational function into the storage unit.

4. The non-transitory storage medium as described in claim 3, wherein the S-parameters stored in the storage unit are in a Touchstone format.

5. An electronic device, comprising:

at least one processor;

storage unit;

a display unit;

one or more programs that are stored in the storage unit and are executed by the at least one processor, the one or more programs comprising:

an acquisition module to read S-parameters f(sk), which are generated at frequency sk, from the storage unit 11;

a parameter supplement module to supplement an S-parameter, which is generated at the frequency sk=0, into the S-parameters f(sk) using an interpolation method, upon the condition that there is no S-parameter which is generated at the frequency sk=0;

a vector fitting module to generate an S-parameter rational function according to the S-parameters f(sk) using a vector fitting algorithm;

a DC compensation module to compensate the DC level of the above S-parameter rational function to generate a compensated S-parameter rational function by:

(a) computing the pole $p_m$ using first formulas as follows:

$$p_{2u} = \frac{u/100 + j \cdot u}{s_N - s_1}, \quad p_{2u-1} = \frac{u/100 - j \cdot u}{s_N - s_1},$$

where u=1~M/2, and M is a total number of the pole values;

(b) generating a matrix $$X : \begin{bmatrix} r_1 \\ \cdots \\ r_M \\ d \\ \tilde{r}_1 \\ \cdots \\ \tilde{r}_M \end{bmatrix}$$

using unknown variables $r_m$, d, and $\tilde{\gamma}_m|$ of functions $(\sigma f)_{fit}(s)$ and $\sigma_{fit}(s)$, wherein the functions $(\sigma f)_{fit}(s)$ and $\sigma_{fit}(s)$ are shown as follows:

$$(\sigma f)_{fit}(s) = f(0) + s \left( \sum_{m=1}^{M} \frac{r_m}{s - p_m} + d \right), \sigma_{fit}(s) = \sum_{m=1}^{M} \frac{\tilde{r}_m}{s - p_m} + 1;$$

(c) substituting the pole values $p_m$ and the S-parameters f(sk) into matrixes A and B, wherein the matrixes A and B are shown as follows:

$$matrixA = \begin{bmatrix} \frac{s_1}{s_1 - p_1} & \cdots & \frac{s_1}{s_1 - p_M} & s_1 & \frac{-f(s_1)}{s_1 - p_1} & \cdots & \frac{-f(s_1)}{s_1 - p_M} \\ \cdots & \cdots & \cdots & \cdots & \cdots & \cdots & \cdots \\ \frac{s_k}{s_k - p_1} & \cdots & \frac{s_k}{s_k - p_M} & s_k & \frac{-f(s_k)}{s_k - p_1} & \cdots & \frac{-f(s_k)}{s_k - p_M} \\ \cdots & \cdots & \cdots & \cdots & \cdots & \cdots & \cdots \\ \frac{s_K}{s_K - p_1} & \cdots & \frac{s_K}{s_K - p_M} & s_N & \frac{-f(s_K)}{s_K - p_M} & \cdots & \frac{-f(s_K)}{s_K - p_M} \end{bmatrix},$$

$$matrixB = \begin{bmatrix} f(s_1) - f(0) \\ \cdots \\ f(s_k) - f(0) \\ \cdots \\ f(s_K) - f(0) \end{bmatrix};$$

(d) computing the unknown variables $r_m$, d, and $\tilde{\gamma}_m$ using a formula $X = (A^T A)^{-1} A^T B$, to get the functions $(\sigma f)_{fit}(s)$ and $\sigma_{fit}(s)$;

(e) recording the got $(\sigma f)_{fit}(s)$ as $(\sigma f)_{fit\_old}(s)$ upon the condition that steps (b)~(d) are only executed one time, and computing the pole values $p_m$ again using a second formula as follows:

$$\sigma_{fit}(s) = \sum_{m=1}^{M} \frac{\tilde{r}_m}{s - p_m} + 1 = \frac{\prod_{m=1}^{M}(s - z_m)}{\prod_{m=1}^{M}(s - p_m)},$$

where $p_m = z_m$, m=1~M;

(f) repeating steps (b)~(d), determining if $|(\sigma f)_{fit}(s) - (\sigma f)_{fit\_old}(s)| < tol$, wherein the tol is a predetermined error, and regarding the got $(\sigma f)_{fit}(s)$ as the compensated S-parameter rational function; and an output module to store the compensated S-parameter rational function into the storage unit.

6. The electronic device as described in claim 5, wherein the S-parameters stored in the storage unit are in a Touchstone format.

* * * * *